(12) United States Patent
Doring

(10) Patent No.: US 8,117,507 B2
(45) Date of Patent: Feb. 14, 2012

(54) DECOMPRESSING METHOD AND DEVICE FOR MATRICES

(75) Inventor: Andreas Christian Doring, Adliswil (CH)

(73) Assignee: International Business Machines Corporation, Armonk, NY (US)

(*) Notice: Subject to any disclaimer, the term of this patent is extended or adjusted under 35 U.S.C. 154(b) by 1206 days.

(21) Appl. No.: 11/641,205

(22) Filed: Dec. 19, 2006

(65) Prior Publication Data

US 2007/0168828 A1 Jul. 19, 2007

(30) Foreign Application Priority Data

Dec. 19, 2005 (EP) .................................... 05112416

(51) Int. Cl.
*G06F 11/00* (2006.01)
(52) U.S. Cl. ........................................ 714/701; 714/758
(58) Field of Classification Search .................. 714/701, 714/758

See application file for complete search history.

(56) References Cited

U.S. PATENT DOCUMENTS

| 4,870,695 | A | * | 9/1989 | Gonzales et al. ............. 382/238 |
| 5,654,734 | A | * | 8/1997 | Orlen et al. ...................... 345/98 |
| 6,144,768 | A | * | 11/2000 | Mahant-Shetti et al. ..... 382/233 |
| 6,573,890 | B1 | * | 6/2003 | Lengyel ......................... 345/419 |
| 6,718,506 | B1 | * | 4/2004 | Sebastian et al. ............. 714/763 |
| 7,594,154 | B2 | * | 9/2009 | Vedantham et al. .......... 714/752 |
| 7,720,651 | B2 | * | 5/2010 | Canning .......................... 703/2 |
| 2005/0010630 | A1 | | 1/2005 | Doring et al. |
| 2005/0229081 | A1 | * | 10/2005 | Lin et al. ....................... 714/769 |
| 2008/0046225 | A1 | * | 2/2008 | Canning ......................... 703/14 |

\* cited by examiner

*Primary Examiner* — M. Mujtaba K Chaudry

(74) *Attorney, Agent, or Firm* — William Stock; Anne Vachon Dougherty

(57) ABSTRACT

Decompressing a matrix having a plurality of redundant matrix rows by reading selected matrix rows including at least all non-redundant matrix rows of the matrix from a memory and computing remaining matrix rows of the matrix from the read matrix rows, wherein several matrix rows are computed simultaneously. The read and the computed remaining matrix rows are provided as the decompressed matrix to an output matrix register.

12 Claims, 5 Drawing Sheets

DECOMPRESSING METHOD AND DEVICE FOR MATRICES

FIELD OF THE INVENTION

The present invention relates broadly to a method and device for decompressing a matrix with a plurality of redundant matrix rows.

BACKGROUND

In computation problems, often matrices are provided from a memory during data processing. One practical example is computation in polynomial remainder rings e.g. used for hashing, integrity check sums, message digests and random number generators. In a particular example, if the polynomial remainder rings are used as checksums they are called cyclic redundancy check (CRC) computations. In one implementation, in a CRC calculation core a vector-matrix multiplier is used to compute v mod p, where v is a polynomial and p is a generator polynomial of the CRC.

The mod-operation is computed by interpreting the coefficients for the polynomial v as a vector, and multiplying it with a matrix m(p) which only depends on p. In such computations involving matrices, it is desirable to compress the matrices for the purposes of accelerating the exchange of the matrix because less data has to be read from memory, and saving costs, because less memory capacity is needed per matrix. In relation to the cost saving aspect it will be appreciated that the saved costs have to be balanced against the associated costs of the decompressor.

The present invention seeks to provide a decompression method and system for decompressing matrices with piecewise redundant matrix rows.

US20050010630A1 relates to a method and an apparatus for determining a remainder in a polynomial ring. The apparatus for determining a remainder in a polynomial ring comprises a value buffer for storing a polynomial value, a factor memory for storing factors and a polynomial multiply unit connected to the factor memory for generating a polynomial product out of the factors and an input polynomial. The apparatus further comprises a matrix multiply unit connected to the polynomial multiply unit for generating a reduced product with reduced polynomial degree by multiplying the polynomial product with a reduction matrix. Finally the apparatus includes a multiplexer means for either conducting the reduced product or the polynomial value as the input polynomial to the polynomial multiply unit.

SUMMARY

In accordance with a first aspect of the present invention there is provided a method of decompressing a matrix having a plurality of redundant matrix rows. The method comprises the steps of reading selected matrix rows including at least all non-redundant matrix rows of the matrix from a memory, and computing remaining matrix rows of the matrix from the read matrix rows, wherein several said matrix rows are computed simultaneously. The read and the computed remaining matrix rows are provided as the decompressed matrix to an output matrix register.

The method can further comprise a step of providing data representing the location of the non-redundant matrix rows in the resulting decompressed matrix. The method can make use of this data to determine which matrix rows should be selected for reading. The method can hence be designed to work with matrices with different locations of the non-redundant matrix rows. This enhances the flexibility of the method.

In accordance with a second aspect of the present invention there is provided a decompressor device for decompressing a matrix having a plurality of redundant matrix rows. The decompressor device comprises a matrix memory for storing therein matrix rows including at least all non-redundant matrix rows of the matrix, and a logic circuit for computing remaining matrix rows of the matrix from the read matrix rows. The decompressor device further comprises an output matrix register for providing the read and the computed remaining matrix rows as the decompressed matrix at an output of the decompressor device. The logic circuit comprises several decompressor blocks, whereby simultaneously several redundant matrix rows, i.e. remaining matrix rows, are computable. Each decompressor block produces a continuous sequence of redundant matrix rows from the input it receives. With more decompressor blocks more matrix rows can be produced in a single cycle. A first design rule could be to provide several words from the matrix memory to a corresponding number of decompressor blocks. Thereby a parallel matrix row computation can take place. There is also room for arranging more decompressor blocks than word lines that come from the matrix memory. Since with matrices that comprise more matrix rows than can be provided by the decompressor blocks in one computation cycle, if the number of decompressor blocks coincides with the number of the word lines from the matrix memory, there is need for at least another cycle of computation for generating the remaining redundant rows. Therefor one can arrange more decompressor blocks that in the second and possible following cycles receive their own input, namely from the matrix memory or in the form of results of the decompressor blocks from the previous cycle, and can also participate in the calculation of redundant matrix rows. With each cycle the number of decompressor blocks that can theoretically participate in the calculation grows linearly with the number of word lines coming from the matrix memory. With two word lines this means in the first cycle one can use two decompressor blocks, in the second cycle 4 decompressor blocks and in the third cycle 6 decompressor blocks, and so on. For a 31 row matrix 8 decompressor blocks would then take 3 cycles, if each decompressor block can produce 3 matrix rows per cycle, just as many as 4 decompressor block would use. This proves that for allowing the matrix to be decompressed within a predetermined number of cycles the number of decompressor blocks is advantageously selected to be large enough to allow this decompression, but not to arrange more than that number of decompressor blocks. The addition of more decompressor blocks would typically only result in a less efficient use of the decompressor blocks, and only an even further increase of the number of decompressor blocks would then again result in a reduction of cycles.

The logic circuit can in a preferred embodiment comprise one or more next-matrix registers. This allows to reuse a previously calculated matrix row in subsequent decompression cycles, thereby allowing to use more decompressor blocks than word lines that come from the matrix memory, and at the same time to speed up the decompression process, since at a given speed of delivery of matrix rows from the matrix, the number of calculated rows is larger than what the decompressor blocks that directly receive the matrix rows from the matrix memory can process therefrom.

The decompressor blocks can in a preferred embodiment comprise several decompressor stages. Per decompressor stage one matrix row is calculated. The number of decompressor stages is selectable dependent on the expected matrix row redundancy, and may also be selected dependent on the logic depth of the surrounding logic in which the decompressor device is embedded. Power consumption is also a factor that could influence the selection. The more decompressor stages are arranged, the lower the power consumption will be in total, since fewer cycles are needed for a given matrix. However, the more decompressor stages are arranged, the more restricted the decompressor device is in handling matrices with more non-redundant matrix rows.

The decompressor stages can in a preferred embodiment comprise a common parameter input, also referred to as poltail input, which is identical for use with a specific matrix but which can vary between different matrices. It allows a higher decompression factor by allowing each decompressor block to reuse this poltail input, while the poltail input needs not be reread at each decompression step from the matrix memory, nor fed though several decompressor stages.

In a preferred embodiment, circular interlinking or interconnecting of the decompressor blocks together with the arrangement of a detuning register allows a handling of matrices with not fixed positions of non-redundancy. The feedback from the next-matrix register to the decompressor blocks is replaced by the cyclic decompressor block structure. The detuning register replaces the next-matrix register with the advantage that it is not restricted to a specific matrix row position, such that it can represent different matrix row positions during different cycles.

The logic circuit can in a preferred embodiment be further designed for accessing data representing the location of the non-redundant matrix rows in the resulting decompressed matrix. The logic circuit can make use of this data to determine which matrix rows should be selected for reading. The logic circuit can hence be designed to work with matrices with different locations of the non-redundant matrix rows. This enhances the flexibility of the device. This data can be provided as additional input to be provided to the decompressor device, or be read into the logic circuit from the matrix memory. A poldegree input can be used for this purpose, representing the degree of the generator polynomial.

This decompressor device structure can in a preferred embodiment be improved to handle more frequently occurring redundancy patterns more efficiently. The decompressor block can herefor comprise a bypass multiplexer. It can be arranged at one or more selected positions within one or more selected decompressor blocks, such that the subsequent decompressor block can reuse the matrix row stored in the detuning register even if the output of a decompressor stage that is not directly preceding the detuning register is to be reused. The arrangement of the bypass multiplexer allows a greater variety of redundancy patterns to be handled, however there may be still redundancy patterns that are not processable herewith. The decompressor stages can comprise an additional logic element enabling to render the function with respect to the previous-matrix row input and the next-matrix row output of the decompressor stage bijective. This allows enforcement of an arbitrary word at any decompressor output. This allows enforcement of a non-redundant row at an arbitrary position, i.e. to handle matrices with arbitrary redundancy patterns.

The output matrix register is preferably connectable to a processing unit for configurable CRC calculation.

DESCRIPTION OF DRAWINGS

Preferred embodiments of the present invention will now be described, by way of example only, with reference to the accompanying drawings.

DETAILED DESCRIPTION OF PREFERRED EMBODIMENTS

The preferred embodiments described provide a method and device for decompressing matrices with a plurality of redundant matrix rows, also referred to as having piecewise redundant matrix rows, for accelerating exchange of a matrix used during a computation because less data has to be read from a matrix memory to provide the matrix. The preferred embodiments will be described herein with reference to matrices used in a CRC calculation core. However, it will be appreciated by a person skilled in the art that the present invention is not limited to a particular computation environment, but rather applies to any computation involving provision of matrices with piecewise redundant matrix rows from memory.

Redundancy between one matrix row A and another matrix row B is given if there is a function to compute the matrix row A when the matrix row B is known. This function can have more input parameters, for instance a parameter common to the whole matrix or a parameter specific for the matrix row A, which requires less storage than the matrix row A itself.

The inventive device allows decompression of a matrix which consists of several sequences of redundant rows interrupted by occurrences of non-redundant rows.

For the CRC example with a 31×32 matrix size, in one version, the matrix rows are arranged as $x^d, \ldots x^{(30+d)}$ (all mod p), while in another version the sequence of the matrix rows is permuted in dependence of the polynomial degree d and the matrix appears as $x^{32}, \ldots x^{(30+d)}, x^d, \ldots x^{31}$ (all mod p). For both versions, a matrix row $x^{(i+1)}$ mod p can be computed by knowing $x^i$ mod p. Hence, there is redundancy from one matrix row to the next, where a parameter related to the generator polynomial p is used in each step. There is also a usable redundancy from the last matrix row to the first matrix row in the matrix row arrangement of the second version. The redundancy relies on the fact that the power $x^{(i+1)}$ mod p can be determined from $x^i$ by using the following equations:

$$x^{(i+1)} \bmod p = x*(x^i \bmod p) \text{ if degree } (x^i \bmod p) < \text{degree } (p)-1,$$

$$x^{(i+1)} \bmod p = x*(x^i \bmod p) + p \text{ otherwise}.$$

Herein degree $(x^i \bmod p) < \text{degree}(p)-1$ is referred to as overflow condition for the matrix row i.

In the second equation, the highest bit of the generator polynomial p and the product cancel out. Therefore, the same computation can be done by adding the generator polynomial p without its highest coefficient and ignoring the highest bit of the product, which would overflow in a register of size equal to the degree of the generator polynomial p. Hereinafter, the generator polynomial p without its leading coefficient is called poltail. It is the same as $x^{degree(p)}$ mod p.

Figure 1A:
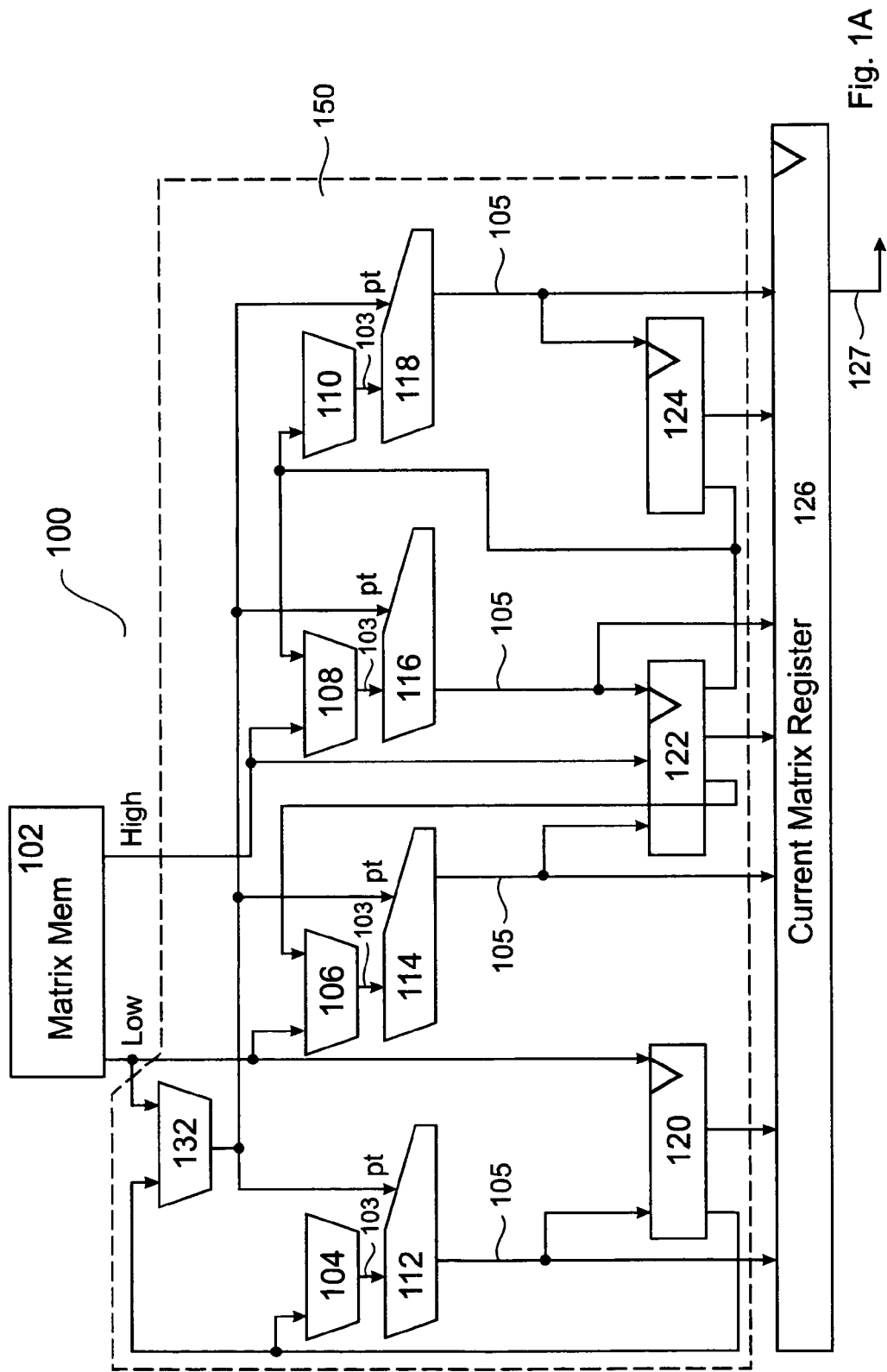
FIG. 1A is a schematic drawing of a decompressor device.

FIG. 1A is a schematic representation of a decompressor device 100 in an example embodiment. The decompressor device 100 comprises a matrix memory 102 which in the example embodiment is a two-word wide memory for a 32-degree matrix. Multiplexers 104, 106, 108 and 110 interface with one of four decompressor blocks 112, 114, 116, 118, respectively. Every decompressor block 112, 114, 116, 118 has two inputs, a previous-matrix row input 103 and a second input, referred to as poltail row input pt. The decompressor device 100 further comprises next-matrix registers 120, 122, 124 for storing intermediate results, such as several words, during the decompression process. The decompressor device 100 further comprises a current-matrix register 126 for providing the decompressed matrix as a vector after completion of the decompression process. While several next-matrix registers 120, 122, 124 are shown in FIG. 1A, they may also be implemented as one common register in an alternative embodiment. The decompressor blocks 114, 116 can receive at their previous-matrix row input 103 via the multiplexer 106, 108 respectively, an input from the matrix memory 102 or from the next-matrix register 122, or 124, respectively while the decompressor blocks 112, 118 receive their input from the next-matrix registers 120 or 122, respectively. This allows to use as the matrix memory 102 a memory which provides only two words but to use at the same time four decompressor blocks 112, 114, 116, 118 for an enhanced decompression speed.

The matrix memory 102 has an output that is split into two words, a higher word and a lower word. The lower word can be transferred through the multiplexer 106 to the decompressor block 114. The higher word from the matrix memory 102 can be transferred through the multiplexer 108 to the decompressor block 116. Both matrix words can also be transferred to the next-matrix registers 120, 122 namely the lower word to the next-matrix register 120, and the higher word to the next-matrix register 122. Input to the decompressor block 112 is provided by the next-matrix register 120. The multiplexer 104 selects which word from the next-matrix register 120 is used herefor. In the same way the decompressor block 118 receives input through the multiplexer 110 from the next-matrix registers 122, 124. The multiplexer 106 is further connected to an output of the next-matrix register 122. The multiplexer 108 is further connected to an output of the next-matrix registers 122, 124. All poltail inputs pt of the decompressor blocks 112, 114, 116, 118 are connected together and connected to an output of a poltail multiplexer 132. The poltail multiplexer 132 is connected to the lower memory word and the next-matrix register 120. The current matrix register 126 is connected to the decompressor outputs 105 of all four decompressor blocks 112, 114, 116, 118 and to outputs of the next-matrix registers 120, 122, 124. The decompressor output 105 of the decompressor block 112 is connected to an input of the next-matrix register 120. The decompressor output 105 of the decompressor block 114 is connected to an input of the next-matrix register 122. The decompressor output 105 of the decompressor block 116 is connected to an input of the next-matrix register 122. The decompressor output 105 of the decompressor block 118 is connected to an input of the next-matrix register 124.

The arrangement comprising the multiplexers 104, 106, 108, 110, the decompressor blocks 112, 114, 116, 118, the next-matrix registers 120, 122, 124, and the poltail multiplexer 132 together form a logic circuit 150 that is designed to compute therefrom the remaining matrix rows, i.e. those matrix rows that have not been stored in the matrix memory 102.

Figure 1B:
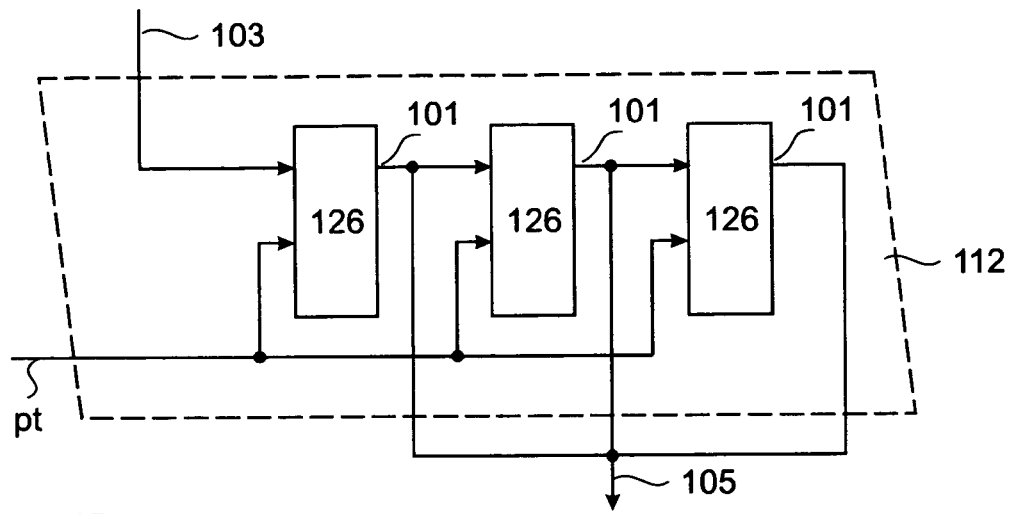
FIG. 1B is a schematic drawing of the structure of a decompressor block.

FIG. 1B shows a schematic representation of the structure of a decompressor block 112. It comprises three decompressor stages 126 arranged in series. A previous-matrix row input 103 is connected to an input of the first of the decompressor stages 126. A poltail row input pt is provided for each of the three decompressor stages 126. The first decompressor stage 126 provides its next matrix row output 101 to the second decompressor stage 126 and also as output of the decompressor block 112. The second decompressor stage 126 provides its next matrix row output 101 to the third decompressor stage 126 and also as output of the decompressor block 112. The third decompressor stage 126 provides also its next-matrix row output 101. All next-matrix row outputs 101 together are provided as decompressor output 105 of the decompressor block 112.

Figure 1C:
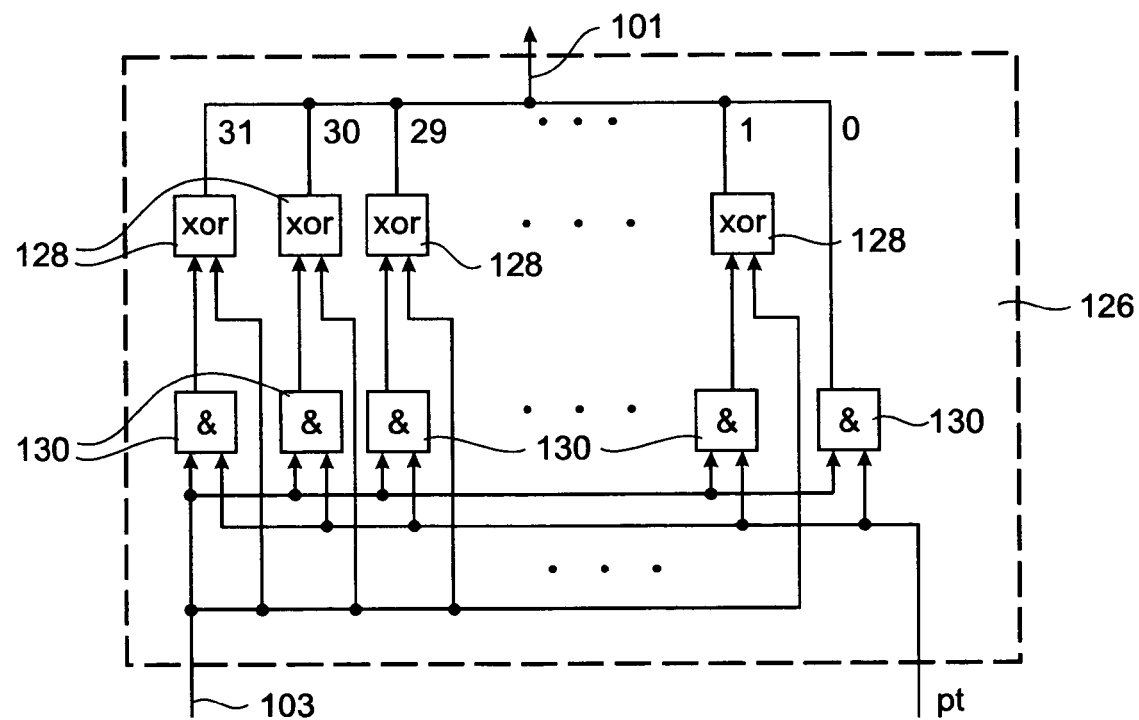
FIG. 1C is a schematic drawing of the structure of a decompressor stage.

FIG. 1C shows a schematic representation of the internal structure of a decompressor stage 126. The decompressor stage 126 has two inputs, a poltail row input pt and a previous-matrix row input 103. The function computed by the decompressor stage 126 is (pmr<<1) XOR (poltail AND pmr[31]), wherein pmr is the previous-matrix row from the previous-matrix row input 103, and wherein pmr[31] is its most significant bit. "<<1" denotes a logical shift left by one digit. This function is realized by thirty-one XOR gates 128 which feed the output digits 1 to 31, and by thirty-two AND gates 130. The outputs of the AND gates 130 are connected each with one corresponding input of the XOR gates 128. The other inputs of the AND gates 130 are connected together to the most significant input digit of the previous-matrix row input 103. The second input of each XOR gate 128 is the corresponding digit of the previous-matrix row input 103, shifted by one, i.e. the input of an XOR gate 128 providing output bit i is connected to the i-ith input bit. The lowest output bit is directly provided by the output of an AND gate 130, which combines the most significant bit of the previous-matrix row input 103 with the least significant bit of the poltail row input pt. The computed function constitutes the next matrix row and is provided as 32 bit output 101 of the decompressor stage 126.

In the following, the decompression method of the example decompressor device 100 will be described for a matrix of 31 matrix rows, wherein each matrix row but the matrix row 0 depends on the respective previous matrix row. In this example scheme, only four matrix rows, namely here the matrix rows 0, 10, 20, and 27, are stored in the matrix memory 102.

In a first step, the decompressor blocks 114, 116 are used to compute the matrix rows 1, 2, 3 from the matrix row 0, and the matrix rows 11, 12, 13 from the matrix row 10, read from the matrix memory 102. Herefor the matrix row 0 is provided from the matrix memory 102 via the multiplexer 106 to the decompressor block 114, and the matrix row 10 is provided from the matrix memory 102 via the multiplexer 108 to the decompressor block 116. Via the decompressor outputs 105 the matrix rows 0, 1, 2, 3, 10, 11, 12, 13 are forwarded to the next-matrix register 122. The matrix rows 0, 1, 2, 3, 10, 11, 12, 13 are stored in the next-matrix register 122. The matrix row 0, read from the matrix memory 102 is also used as the poltail in the first step, and the stored matrix row 0 in the next-matrix register 122 is used as the poltail in the following steps. This is possible since the matrix row 0 corresponds to $x^{32}$ mod p and p has degree 32.

In a next step, the matrix row 20 is read from the matrix memory 102 and the following matrix rows are calculated by the respective decompressor blocks:

Matrix rows 21, 22, 23 are calculated by the decompressor block 114.
Matrix rows 4, 5, 6 are calculated by the decompressor block 118.
Matrix rows 14, 15, 16 are calculated by the decompressor block 112.

The matrix row 20 and the computed matrix rows 4, 5, 6, 14, 15, 16, 21, 22, and 23 are stored in the next-matrix registers 122, 124.

The non-redundant matrix row 0, which is used by all decompressor blocks 112, 114, 116, 118 for the calculation of the redundant matrix rows, is provided to the decompressor blocks 112, 114, 116, 118, via the multiplexer 132 from the next-matrix register 120 from this cycle onwards.

In a final step, the matrix row 27 is read from the matrix memory 102 and the matrix rows 28, 29, 30 are computed by the decompressor block 112. The remaining matrix rows are computed as follows:

The matrix rows 7, 8, 9 are computed by the decompressor block 114.
The matrix rows 17, 18, 19 are computed by the decompressor block 116.
The matrix rows 24, 25, 26 are computed by the decompressor block 118.

Accordingly, in that final step, all 31 matrix rows are provided to the current-matrix register 126, wherein the matrix rows 7, 8, 9, 17, 18, 19, 24, 25, 26, 28, 29, 30 arrive directly from the decompressor blocks 112, 114, 116, 118, whereas the remaining matrix rows are provided to the current-matrix register 126 from the next-matrix registers 122, 124.

The current-matrix register 126, also referred to as output matrix register, thereafter contains all matrix rows 1 to 31, i.e. the read matrix rows, and the computed matrix rows, which are available as a decompressed matrix at its register output 127.

The above described method hence comprises the following steps: Selected matrix rows are read from the matrix memory 102. The selection comprises at least all non-redundant matrix rows of the matrix. If more matrix rows are read, the decompression will be faster, but at the same time more memory space will be needed to store those redundant matrix rows. The read matrix rows are provided to the logic circuit 150 for computing the remaining matrix rows of the matrix from the read matrix rows. There the remaining matrix rows of the matrix are computed, wherein several of the remaining matrix rows are computed simultaneously. This is here accomplished by using several decompressor blocks. The read matrix rows and the computed remaining matrix rows together form the decompressed matrix which is finally available at the output matrix register 126.

It can be seen from the above description that the provision of the matrix rows to the output matrix register 126 need not be simultaneous. The number of cycles it takes until the matrix rows are all present at the output matrix register 126 depends on the complexity of the logic circuit 150. The more decompressor blocks are provided to simultaneously compute the remaining matrix rows, the fewer cycles it takes to arrive at the complete decompressed matrix.

In a modification of the decompressor device 100 and its associated decompression method, the reading of the matrix row 27 and the computation of the matrix rows 28, 29 and 30 could be done in the second step, i.e. all four decompressor blocks 112, 114, 116, 118 would be used in the second step rather than in the last. In such a modification, additional storage/next-matrix registers are used. However, such a modified embodiment still provides the same compression/decompression rate at the same number of cycles. The connection from the decompressor block 116 to the current-matrix register 126 is not needed in this modified version and can hence be renounced.

The decompressor device 100 can be modified to handle polynomials of lower degree in each matrix row if the sequence of the matrix rows is static, i.e. $x^d, \ldots x^{(30+d)}$ (all mod p).

Figure 2:
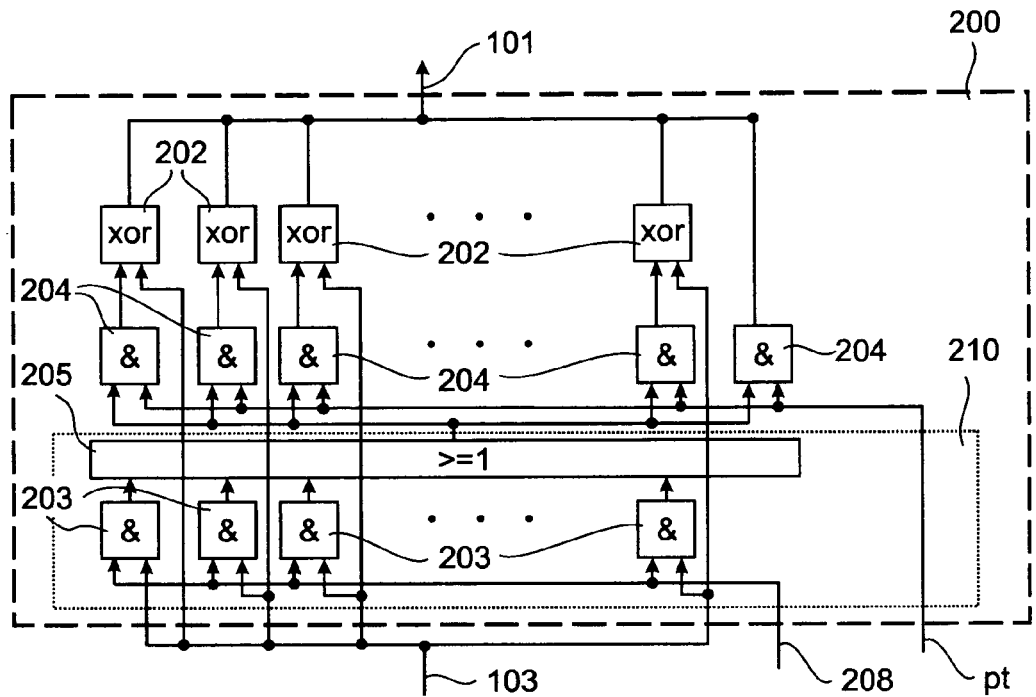
FIG. 2 is a schematic drawing of a modified decompressor stage.

A schematic drawing of a modified decompressor stage 200 in an example embodiment is shown in FIG. 2. The modified decompressor stage 200 again comprises a plurality of XOR gates 202 and associated AND gates 204. An additional input 208, referred to as poldegree input 208 in this example embodiment, and common to all decompressor stages 200 of each decompressor block 112, 114, 116, 118, is used which provides the polynomial degree in a one-hot-encoded way, i.e. for a polynomial of degree d, the d-th bit has the value 1 and all other bits have the value 0. The poldegree input 208 is connected to thirty-one AND gates 203 whose other input receives the corresponding bit of the previous-matrix row 103. The poldegree input 208 allows for the logic circuits to learn which matrix rows are non-redundant. Hence the decompressor device can handle matrices with different redundancy patterns.

The function computed by the decompressor stage 200 shown in FIG. 2 is (pmr<<1) XOR (poltail AND (NOT ((poldegree AND pmr)=0))). Thereby the previous-matrix row input 103 is bitwise AND-combined with the poldegree input 208. The result word is tested in a wide OR gate 205, whether it is zero or not. The test result is used instead of pmr[31] in FIG. 1C as the common input to the AND gates 130. The remainder of the structure in FIG. 2 is the same as in FIG. 1C. The computed function constitutes the next matrix row and is provided as 32 bit output 101 of the modified decompressor stage 200. In this modification, a logic circuit for implementing the embodiment thus comprises an additional logic element 210. Such a modified embodiment still provides about the same compression/decompression rate at the same number of cycles. The additional logic element 210 provides for the handling of the poldegree input 208 that delivers data representing the location of the non-redundant matrix rows in the resulting decompressed matrix.

While in this modification the decompressor device 100 can handle varying degrees up to a maximum degree, it is fixed with respect to the positions of matrix rows which are read from the matrix memory 102.

Figure 3A:
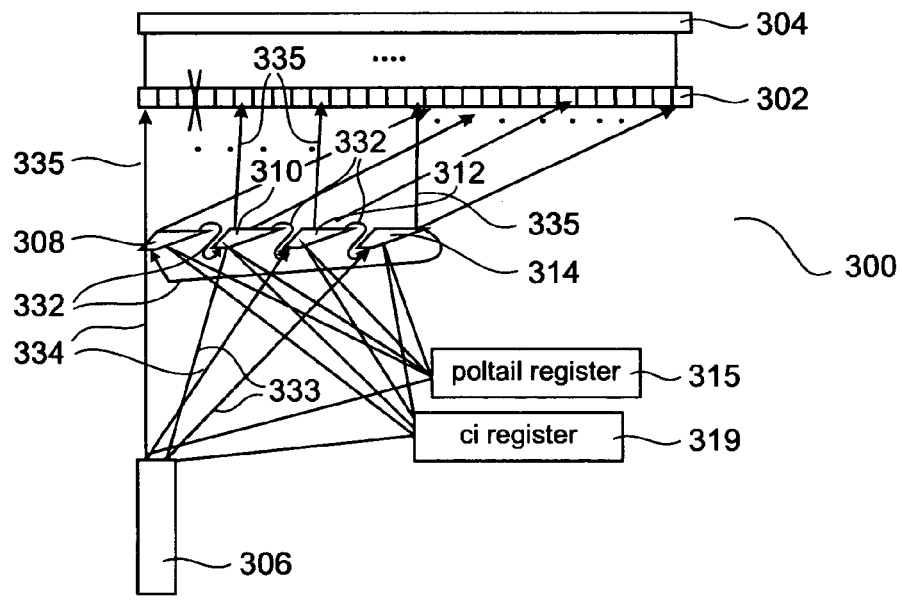
FIG. 3A is a schematic drawing of decompressor device with a ci register and a poltail register.

In the following, another embodiment which provides flexibility in the position of matrix rows which are read from the matrix memory 102 will be described. A schematic representation of such a decompressor device 300 in an example embodiment is shown in FIG. 3A. It is also here designed to handle matrices of 31 matrix rows. The decompressor device 300 comprises a next-matrix register 302, a current-matrix register 304 and a two-word wide matrix memory 306. Four decompressor blocks 308, 310, 312, 314 are provided, connected to each other in a circular way, i.e. the output 332 of each of the decompressor blocks 308, 310, 312, 314 is connected to the input of one of the subsequent decompressor blocks 310, 312, 314, 308. Each decompressor block 310, 312, 314, 308 is wired for accessing the matrix memory 306. Thereby, the decompressor blocks 308 and 312 are connected to the lower memory word 334 and decompressor blocks 310 and 314 are connected to the higher memory word 333. Unlike in the embodiments described above with reference to FIGS. 1A, 1B, 1C and FIG. 2, there is no feedback from the next-matrix register 302 to the decompressor blocks 308, 310, 312, 314, since such a feedback would fix the positions of matrix rows read from the matrix memory 306, i.e. fix the positions where redundancy is allowed to be present. In the embodiment shown in FIG. 3A, each decompressor block 308, 310, 312, 314 has four decompressor outputs 335, and each of these decompressor outputs 335 is connected with two matrix rows of the next-matrix register 302, with one exception. The 4th output of the first decompressor block 308 is here only connected to one matrix row because there are in total sixteen (4 decompressor blocks with 4 decompressor outputs each) decompressor outputs 335 but only thirty-one matrix rows. This represents a principle after which the positions at which the decompressor outputs 335 are connected to the next-matrix memory 302 can be adapted to the expected redundancy pattern of the matrix. This means that such a bypass multiplexer can be arranged to bypass a different decompressor stage than depicted in FIG. 3B. For even further improvement it may be even a better design to provide for bypass multiplexers at several decompressor stages thereby allowing use of an imbalanced distribution per decompressor stage of matrix rows connected to the decompressor outputs 335. This can prove advantageous to enable better handling of most frequent redundancy patterns.

There are furthermore two registers, a poltail register 315 and a ci register 319, for precalculating and storing the overflow condition for all matrix rows. The poltail register 315 is used, since $x^{degree(p)}$ mod p may not be a matrix row, or at least not stored as such, due to the flexibility in sequence.

Figure 3B:
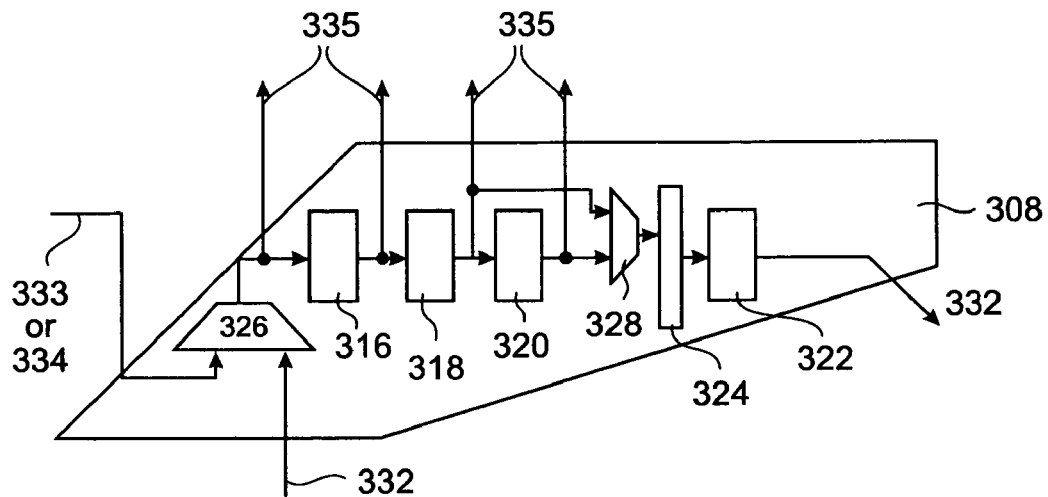
FIG. 3B is a schematic drawing of a decompressor block of the decompressor device of FIG. 3A.

FIG. 3B shows a schematic representation of one of the identical decompressor blocks 308 of the decompressor device 300. It comprises four decompressor stages 316, 318, 320, 322, a detuning register 324 and two multiplexers 326, 328. The multiplexer 326 determines which of its input, either the higher memory word 333 or lower memory word 334 from the matrix memory 306, or the output 332 from the previous decompressor block 314 is used. Therein the lower memory word 334 from the matrix memory 306 is connected to the decompressor blocks 308, 312, whereas the higher memory word 333 from the matrix memory 306 is connected to the decompressor blocks 310, 314. Each of the decompressor outputs 335 is connected, as shown in FIG. 3A, to two different matrix rows of the next-matrix register 302 with exception of one of the decompressor outputs 335, due to the difference between the number of decompressor outputs 335 and matrix rows. The detuning register 324 is arranged before the last decompressor stage 322 for pipe-detuning in the example embodiment. In this detuning register 324 a matrix row is kept, which is used for continued decompression by the next decompression block 310, ignoring the delayed use by the last decompressor stage 322. Because the decompressor block 308 provides values for several matrix rows, in the course of a decompression the detuning register 324 can be used for several different matrix rows. The bypass multiplexer 328 allows bypassing of one decompressor stage 320 by providing the output of the decompressor stage 318 to the detuning register 324 alternatively to the decompressor output 335 of the decompressor stage 320. This is only used in the first decompressor block 308, because the fourth decompressor output 335 of this decompressor block 308 is used only for one matrix row, while all other decompressor outputs 335 are used for two matrix rows. If there is redundancy on both sequences of matrix rows, where the fourth decompressor output 335 is used, and at those where it is not used, these redundancies can only be used with this bypass multiplexer 328. Without the bypass multiplexer 328 between two adjacent matrix rows two decompressor stages would be placed, instead of one.

Figure 3C:
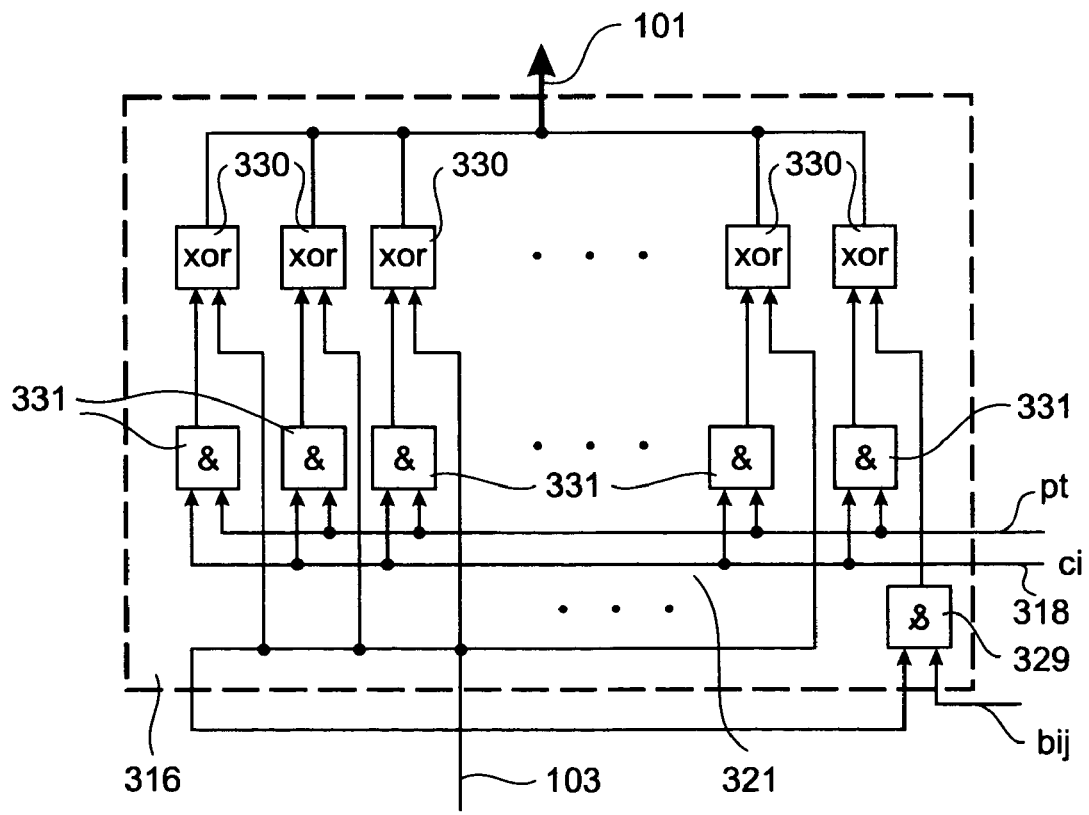
FIG. 3C is a schematic drawing of a decompressor stage of the decompressor block of FIG. 3B.

FIG. 3C shows the internal structure of one of the decompressor stages 316 of the decompressor block 308 of FIG. 3B. The decompressor stage 316 comprises thirty-two XOR gates 330 at whose one input the output of a corresponding AND gate 331 is arranged. At the other input each XOR gate 330 receives the corresponding digit of the previous-matrix row input 103. Each of the AND gates 331 receives from the ci register 319 overflow condition values at a ci input 318, and the other input is connected to the poltail row input pt. The computed function constitutes the next-matrix row and is provided as 32 bit output 101 of the decompressor stage 316. Instead of the most significant bit of each matrix row being generated from the previous-matrix row, the most significant bit is stored separately, i.e. one bit for each resulting matrix row, in a ci register 319 (see FIG. 3A) and is provided explicitly to the decompressor stage 316 via a ci input 321. Since the decompressor stage 316 is used for several matrix rows in the course of a decompression, several ci values are provided to the ci input from the ci register 319. Therefore, between the ci register 319 and the ci input 318 a multiplexer is arranged (not depicted) to select the corresponding bit. An input $b_{ij}$ enforces a bijective behavior by modifying the left-shift into a left-rotate operation. Bijective behavior means that the function computed by the decompressor stage 316 has an inverse. Therefore, if a given output value is desired at the decompressor stage 316, an input can be determined, which will create this desired output value. Herefor the most significant bit of the previous matrix row 103 is led together with the input $b_{ij}$ to an AND gate 329 such that the input $b_{ij}$ determines whether the bijective mode is needed. This signal is determined by the redundancy pattern of the matrix. In the example of the CRC mode, the occurrence of the break in order, i.e. at $x^d$, is the position where the bijective mode will be set. It is generally used when the decompressor stage 316 is processing a non-redundant matrix row, i.e. when a matrix row as read from the matrix memory 306 is provided to the next-matrix register 302 from the decompressor output 335 of the decompressor stage 316 connected to that particular entry in the next-matrix register 302 after passing through one or more decompressor stages 316, 318, 320, 322. In the example embodiment, the last decompressor stage 322 (see FIG. 3B) does not require this input $b_{ij}$, as, if it is used before a non-redundant matrix row, the next matrix row output into the next-matrix register 302 can be fed directly from the matrix memory 306 via the multiplexer 326.

Instead of using multiplexers or similar circuit components to create a bypass path for the decompressor stage 320, the embodiment shown in FIG. 3C allows modification to the stored matrix row in the decompressor stage 316, but the added two gates 329, and 330 enforce a bijective behaviour. This allows a matrix row read from the matrix memory 306 to be driven through the decompressor stage 316 to its decompressor output 335, i.e. without a net modification. In this way, sets of several decompressor stages can be used with a fixed association of next-matrix register matrix rows to the decompressor outputs 335, while providing the flexibility of allowing non-redundant matrix rows to be associated with the decompressor stages 316, 318, 320, 322 anywhere in the respective decompressor block 308.

For every non-redundant matrix row not associated with the decompressor output 335 at a decompressor stage 316, 318, 320, 322 at a forward boundary between the decompressor blocks 308, 310, 312, 314, the decompressor block 308, 310, 312, 314 in which the associated decompressor stage 316, 318, 320, 322 is located is used with a new input word to provide the stored matrix row to the next-matrix register 302. Therefore, an unbalanced behaviour of the decompressor device 300 may result when the non-redundant matrix rows all fall to the same decompressor stage output 335.

The decompressor output 335 at each decompressor stage 316, 318, 320, 322 has fixed connections to several matrix rows of the next-matrix register 302. When the number of matrix rows in the matrix is not dividable by the number of decompressor blocks 308, 310, 312, 314, with the same number of decompressor stages 316, 318, 320, 322 each, as is the case in the example embodiment shown in FIG. 3, there will be decompressor stages 316, 318, 320, 322 that are connected to fewer matrix rows than others. Preferably, this irregularity is used to arrange the association of block boundary to matrix rows in a way which is more efficient for a particular application environment in various embodiments.

For example, for a CRC calculator, polynomial degrees of 8, 12, 16 and 32 are frequent, i.e. occur more often in typical application scenarios than other degrees. With four decompressor stages 316, 318, 320, 322 per decompressor block 308, 310, 312, 314, in the example embodiment after the seventh matrix row, after the eleventh matrix row, and after the fifteenth matrix row a block boundary should be associated. Furthermore, the first matrix row should be associated with a block boundary as well for a degree of 32. Therefore, in the example embodiment the irregularity is located after the third matrix row, i.e. the output of the third decompressor stage 320 in decompressor block 308 is connected to only one next-matrix register matrix row. As a result, the relevant decompressor blocks 308, 310, 312, 314 do not require double employment with two different read matrix rows for the above mentioned frequent cases.

Figure 4:
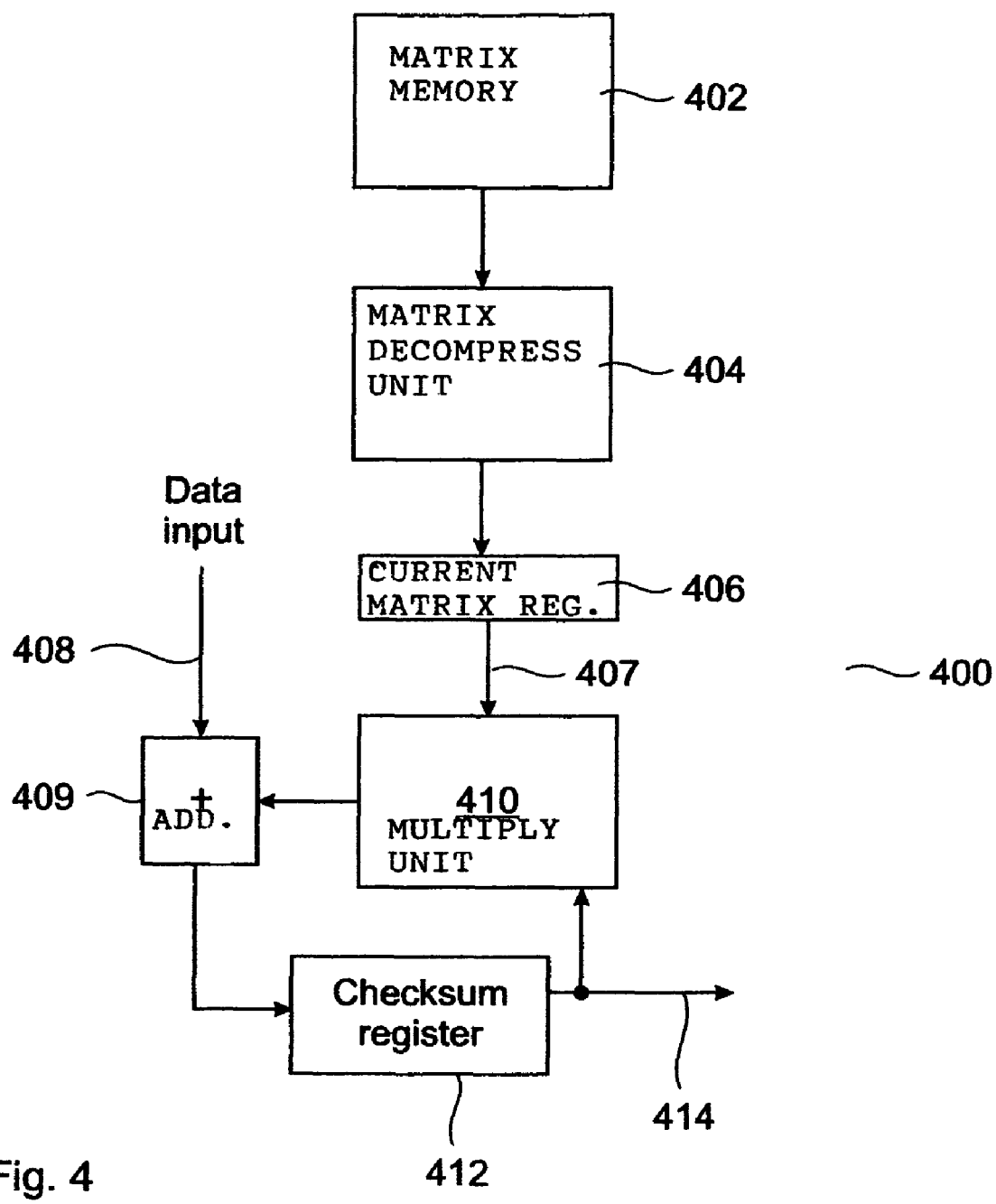
FIG. 4 is a schematic drawing of a configurable streaming CRC calculation unit.

FIG. 4 shows a schematic drawing of a configurable streaming CRC calculation unit 400 in an example embodiment of the present invention. The CRC calculation unit 400 comprises a matrix memory 402 connected to a matrix decompressor unit 404, that again is connected to a current-matrix register 406. The matrix decompressor unit 404 is equivalent to the logic circuit 150, and performs the matrix decompression in accordance with the above described method. The output 407 of the current-matrix register 406 is connected to a matrix-vector multiply unit 410. The CRC calculation unit 400 further comprises a data input 408 that is connected to an input of an adder 409 whose other input is connected to the output of the matrix-vector multiply unit 410. The adder 409 has an output that is connected to an input of a checksum register unit 412. The output of the checksum register unit 412 provides the other input to the matrix-vector multiply unit 410 and is also available as checksum output 414 of the CRC calculation unit 400. The matrix-vector multiply unit 410 multiplies the content of the checksum register 412 with the decompressed matrix that comes from the current-matrix register 406. This multiplication step is configurable through provision of different decompressed matrices from the matrix memory 402 into the current-matrix register 406, as described above with reference to FIGS. 1 to 3.

Various alterations and modifications can be made to the techniques and arrangements described herein, as would be apparent to one skilled in the relevant art. Any of the shown embodiments can be combined in total or in part.

The described method can be coded in form of a computer program element comprising computer program code means which, when loaded in a processor of a data processing system, configures the processor to perform a method for generating attack signatures.

Furthermore the present invention can be realized in hardware or a combination of hardware and software. The method according to the present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software could be a general purpose computer system with a computer program that, when being loaded and executed, controls the computer system such that it carries out the methods described herein. The present invention can also be embedded in a computer program product, which comprises all the features enabling the implementation of the methods described herein, and which—when loaded in a computer system—is able to carry out these methods.

A computer program or computer program means in the present context mean any expression, in any language, code or notation, of a set of instructions intended to cause a device having an information processing capability to perform a particular function either directly or after either or both of the following a) conversion to another language, code or notation; b) reproduction in a different material form.

The invention claimed is:

1. A computer-implemented method of transforming a first matrix, having a plurality of redundant matrix rows and non-redundant rows and including a parameter for a function for computing a redundant row from a non-redundant row, into a decompressed matrix, the method comprising at least one decompressor device performing steps of:
    reading selected matrix rows from said first matrix including at least all non-redundant matrix rows of the first matrix from a matrix memory;
    computing remaining redundant matrix rows of the first matrix from the read non-redundant matrix rows, wherein more than one of said redundant matrix rows are computed in parallel; and
    providing the read matrix rows and the computed remaining matrix rows as a decompressed matrix to an output matrix register.

2. The method as claimed in claim 1, further comprising the step of providing data representing the location of the non-redundant matrix rows in the resulting decompressed matrix to determine which matrix rows are selected for reading.

3. The method as claimed in claim 1, wherein the method is utilized for decompression of a matrix in a configurable CRC calculation.

4. A decompressor device for transforming a first matrix, having a plurality of redundant matrix rows and non-redundant rows and including a parameter for a function for computing a redundant row from a non-redundant row, into a decompressed matrix, the device comprising:
    a matrix memory for storing selected matrix rows including at least all non-redundant matrix rows of the first matrix;
    a logic circuit for using the read matrix rows to compute remaining redundant matrix rows of the first matrix, wherein said logic circuit comprises a plurality of decompressor blocks for computing remaining redundant matrix rows from the read matrix rows in parallel; and
    an output matrix register for providing the read and the computed remaining matrix rows as a decompressed matrix.

5. The device as claimed in claim 4, wherein said logic circuit comprises at least one next-matrix register for storing matrix rows for reuse by the decompressor blocks.

6. The device as claimed in claim 4, wherein said decompressor blocks comprise several decompressor stages for computing several matrix rows from one read matrix row.

7. The device as claimed in claim 6, wherein the decompressor stages comprise a poldegree input that delivers data representing the location of the non-redundant matrix rows in the resulting decompressed matrix.

8. The device as claimed in claim 4, wherein each decompressor block comprises a detuning register for storing the resulting matrix row, and wherein the decompressor blocks are interconnected in a circular way.

9. The device as claimed in claim 6, wherein at least one of the decompressor blocks comprises a bypass multiplexer for multiplexing the decompressor output of two or more of the decompressor stages.

10. The device as claimed in claim 6, wherein the decompressor stages comprise a bijective input ($b_{ij}$) for enforcing a predetermined decompressor output.

11. The device as claimed in claim 4, wherein the output matrix register is connected to a processing unit for configurable CRC calculation.

12. A program storage device readable by machine storing a program of instructions executable by the machine to perform a method for transforming a first matrix, having a plurality of redundant matrix rows and non-redundant rows and including a parameter for a function for computing a redundant row from a non-redundant row, into a decompressed matrix, the method comprising at least one decompressor device performing steps of:

receiving input of selected matrix rows including at least all non-redundant matrix rows of the first matrix read from a matrix memory;

computing remaining redundant matrix rows of the first matrix from the read non-redundant matrix rows, wherein more than one of said redundant matrix rows are computed in parallel; and providing the read matrix rows and the computed remaining matrix rows as a decompressed matrix to an output matrix register.

* * * * *